(12) United States Patent
Miyama et al.

(10) Patent No.: US 12,506,000 B2
(45) Date of Patent: Dec. 23, 2025

(54) METHOD OF FILLING GAP WITH FLOWABLE CARBON LAYER

(71) Applicant: ASM IP Holding B.V., Almere (NL)

(72) Inventors: Ryo Miyama, Hachioji (JP); Yoshio Susa, Tama (JP); Yoshiyuki Kikuchi, Tokyo (JP); Hirotsugu Sugiura, Tama (JP)

(73) Assignee: ASM IP Holding B.V., Almere (NL)

( * ) Notice: Subject to any disclaimer, the term of this patent is extended or adjusted under 35 U.S.C. 154(b) by 802 days.

(21) Appl. No.: 17/720,214

(22) Filed: Apr. 13, 2022

(65) Prior Publication Data

US 2022/0336204 A1 Oct. 20, 2022

Related U.S. Application Data

(60) Provisional application No. 63/175,979, filed on Apr. 16, 2021.

(51) Int. Cl.
| | | |
|---|---|---|
| *H01L 21/02* | (2006.01) | |
| *C23C 16/26* | (2006.01) | |
| *C23C 16/455* | (2006.01) | |
| *C23C 16/52* | (2006.01) | |
| *H01J 37/32* | (2006.01) | |

(52) U.S. Cl.
CPC ........ *H01L 21/0228* (2013.01); *C23C 16/26* (2013.01); *C23C 16/4554* (2013.01); *C23C 16/45544* (2013.01); *C23C 16/45553* (2013.01); *C23C 16/52* (2013.01); *H01J 37/32449* (2013.01); *H01L 21/02118* (2013.01); *H01L 21/02205* (2013.01); *H01L 21/02274* (2013.01); *H01L 21/0234* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 10,388,513 | B1 | 8/2019 | Blanquart |
| 10,755,922 | B2 | 8/2020 | Blanquart |
| 10,755,923 | B2 | 8/2020 | Blanquart |
| 11,282,698 | B2 | 3/2022 | Blanquart |
| 2014/0045342 | A1* | 2/2014 | Mallick ............ H01L 21/02115 438/778 |
| 2020/0013612 | A1* | 1/2020 | Blanquart ......... H01L 21/76837 |
| 2021/0151348 | A1 | 5/2021 | Utsuno |
| 2021/0225642 | A1 | 7/2021 | Utsuno |
| 2021/0238742 | A1 | 8/2021 | Susa |
| 2021/0366712 | A1 | 11/2021 | Susa |

* cited by examiner

*Primary Examiner* — Jose I Hernandez-Kenney
(74) *Attorney, Agent, or Firm* — Snell & Wilmer L.L.P.

(57) ABSTRACT

Methods and systems for forming a structure including multiple carbon layers and structures formed using the methods or systems are disclosed. Exemplary methods include forming a first carbon layer with an initial first flowability and a second carbon layer with an initial second flowability, wherein first flowability is less than second flowability.

21 Claims, 6 Drawing Sheets

METHOD OF FILLING GAP WITH FLOWABLE CARBON LAYER

CROSS-REFERENCE TO RELATED APPLICATIONS

This application claims the benefit of U.S. Provisional Application No. 63/175,979, filed on Apr. 16, 2021, in the United States Patent and Trademark Office, the disclosure of which is incorporated herein in its entirety by reference.

FIELD OF INVENTION

The present disclosure generally relates to methods of forming structures suitable for use in the manufacture of electronic devices. More particularly, examples of the disclosure relate to methods of forming structures that include carbon layers, to structures including such layers, to devices formed using the methods and structures, and to systems for performing the methods and/or forming the structures.

BACKGROUND OF THE DISCLOSURE

During the manufacture of devices, such as semiconductor devices, it is often desirable to fill gaps, also referred to as recesses (e.g., trenches or regions between features), on the surface of a substrate with insulating or dielectric material. Some techniques to fill gaps include the deposition of a layer of flowable carbon material, such as spin on carbon (SOC). For many applications, use of carbon material, such as SOC, has many desirable properties, such as filling capability, etch selectivity, aching efficiency, and the like.

Although use of carbon material to fill gaps can work well for some applications, filling gaps using traditional deposition techniques has several shortcomings, such as when, for example, the gaps include a multiple-(e.g., double-) trench structure rather than a single-trench structure. In a multiple-trench structure, a first trench can include one or more second trenches formed within the first trench. First trenches can be spaced apart at a first pitch and the second trenches within the first trench can be spaced apart at a second pitch. Aspect ratios of the first and second trenches can be significantly different, which can result in the traditional deposition technique creating an undesired roughness on a surface of carbon material deposited within the multiple-trench structure. It is generally desirable to obtain a relatively planarized surface of the carbon material for subsequent processing, such as photolithography, etching of material, and/or depositing of materials. If a flatness and/or roughness of a surface of the carbon material is not at suitable levels, undesirable variation in critical dimensions (CD) and/or line edge roughness (LER) may result in resist patterns and features that are subsequently formed.

Further, use of SOC can be relatively expensive, because SOC processes use additional processing equipment, such as coaters and ovens. And, SOC processes generally include additional processing steps, such as coating, baking, and curing. The use of such additional equipment and processing steps can add unwanted time and expense to methods of forming structures used to form devices.

Accordingly, improved methods for forming structures, particularly for methods of filling gaps or recesses on a substrate surface with flowable carbon material, that are suitable for providing relatively flat, smooth surfaces are desired. Further improved structures and devices, as well as systems for forming such structures and devices, are desired.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

Various embodiments of the present disclosure relate to methods of forming structures suitable for use in the formation of electronic devices, to structures formed using the methods, and to systems for performing the methods. While the ways in which various embodiments of the present disclosure address drawbacks of prior methods, structures, and systems are discussed in more detail below, in general, exemplary embodiments of the disclosure provide improved methods for forming structures that include two or more carbon layers having different properties. Use of the two or more carbon layers in the formation of structures—e.g., to fill (e.g., multiple-trench) recesses—can improve a flatness of the recess fill material, which in turn, can provide for reduced variation in critical dimensions and reduced line edge roughness in features formed using methods described herein, compared to traditional methods.

In accordance with various embodiments of the disclosure, methods of forming a structure are provided. Exemplary methods include providing a substrate within a reaction chamber, forming one or more first carbon layers overlying a surface of the substrate, at least one of the one or more first carbon layer having a first initial flowability, and forming a second carbon layer with a second initial flowability overlying the first carbon layer. The substrate can include one or more recesses formed on the surface of the substrate. The first and second carbon layers can be used to fill the one or more (e.g., multiple-trench) recesses (e.g., each trench or recess having aspect ratios of about 3.0 to about 100.0) without void formation and to provide a relatively smooth surface for subsequent processing. In accordance with examples of these embodiments, the second initial flowability of the second carbon layer is greater than the first initial flowability of the first carbon layer. As used herein, initial flowability can refer to a flowability of material as the material deposits on the surface of the substrate. A flowability of the carbon material can depend on various factors, including, for example the thickness of the carbon material. In accordance with examples of the disclosure, the second carbon layer may be thicker than the one or more of the first carbon layers. The second initial flowability greater than the first flowability facilitates planarized filling of multiple-trench structures—e.g., without requiring additional steps, such as an etch process. In accordance with further aspects of these embodiments, the step of forming the one or more first carbon layers comprises forming a first initially viscous layer within the one or more recesses and treating the first initially viscous layer using a first plasma process. In accordance with further examples, the step of forming the second carbon layer comprises forming a second initially viscous layer within the one or more recesses and treating the second initially viscous layer using a second plasma process. The first plasma process can utilize a first plasma power, the second plasma process can utilize a second plasma power, and the second plasma power can be greater than the first plasma power.

Additionally, or alternatively, the first initially viscous layer can be treated with the first plasma process for a first treatment time, the second initially viscous layer can be treated with the second plasma process for a second treatment time. In accordance with examples of these embodiments, the second treatment time can be greater than the first treatment time. Additionally, or alternatively, the first plasma process can include a first ion energy level and a first flux, the second plasma process can include a second ion energy level and a second flux. In accordance with examples of these embodiments, the second ion energy level and/or second flux can be greater than the first ion energy level and/or first flux. In accordance with further examples, a growth per cycle of the second initially viscous layer is higher than a growth per cycle of the first initially viscous layer.

In accordance with various embodiments of the disclosure, the temperature within the reaction chamber during the steps of forming one or more first carbon layers and/or the second carbon layer may be less than 100° C. Further, the step of forming the one or more first carbon layers can include providing a carbon precursor to the reaction chamber, wherein a chemical formula of the carbon precursor is represented by $C_xH_yN_zO_a$, wherein x is a natural number of 2 or more, y is a natural number, z is 0 or a natural number, and a is 0 or a natural number. In another exemplary embodiment the first plasma process and/or the second plasma process may comprise forming excited species from one or more of He, Ar, or N2.

In accordance with additional embodiments of the disclosure, a structure is formed, at least in part, according to a method described herein. A structure can include a first carbon layer and a second carbon layer. The first and second carbon layers can be formed within one or more multiple (e.g. double-) trench structures on a substrate. In one additional exemplary embodiment of the disclosure, a surface of the second carbon layer is planarized.

In accordance with yet further embodiments of the disclosure, a system is provided for performing a method and/or for forming a structure as described herein. Exemplary systems can include one or more reaction chambers, a carbon precursor source, an inert gas source, a plasma power source, an exhaust source, and a controller. The controller can be configured to control gas flow of the carbon precursor into at least one of the one or more reaction chambers to form a first carbon layer and a second carbon layer overlying the first carbon layer, wherein a flowability of the second carbon layer is greater than a flowability of the first carbon layer; the first carbon layer can include a first thickness and the second carbon layer can include a second thickness, wherein the second thickness is greater than the first thickness.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIG. 6 illustrates a system in accordance with exemplary embodiments of the disclosure It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods suitable for forming structures, to structures formed using the methods, and to systems for performing the methods and/or forming the structures. By way of examples, the methods described herein can be used to fill recesses or gaps (e.g., trenches or vias or spaces between features, such as lines or protrusions) on a surface of a substrate with flowable carbon material, and are particularly well suited for filling multiple- (e.g., double-) trench structures.

Exemplary methods include forming two or more carbon layers having different properties (e.g., flowability). Use of multiple carbon layers, in which at least two layers exhibit different properties, can provide for desired recess fill properties. Further, structures formed using the two or more carbon layers can exhibit a relatively flat, smooth surface. The relatively flat, smooth surfaces of the structures can result in patterning with reduced critical dimension (CD) variation and/or reduced line edge roughness (LER) in patterned resist and/or of features formed on the surface of the structure.

As set forth in more detail below, carbon layers can be treated with an activated species to alter one or more properties of initially deposited carbon material, such as flowability, hardness, and the like. A change in the properties can depend on deposition parameters and/or treatment parameters, such as ion energy and/or flux of excited species used during a treatment step. As further set forth below, different treatment processes can be used for first and second carbon layers to obtain desired layer properties and allow for varying thicknesses of two or more carbon layers.

In this disclosure, "gas" can refer to material that is a gas at normal temperature and pressure, a vaporized solid and/or a vaporized liquid, and may be constituted by a single gas or a mixture of gases, depending on the context. A gas other than a process gas, i.e., a gas introduced without passing through a gas distribution assembly, such as a showerhead, other gas distribution device, or the like, may be used for, e.g., sealing a reaction space, which includes a seal gas, such as a rare gas. In some cases, such as in the context of deposition of material, the term "precursor" can refer to a compound that participates in the chemical reaction that produces another compound, and particularly to a compound that constitutes a film matrix or a main skeleton of a film, whereas the term "reactant" can refer to a compound, in some cases other than a precursor, that activates a precursor, modifies a precursor, or catalyzes a reaction of a precursor; a reactant may provide an element (such as O, H, N, C) to a film matrix and become a part of the film matrix when, for example, power (e.g., radio frequency (RF) power) is applied. In some cases, the terms precursor and reactant can be used interchangeably. The term "inert gas" refers to a gas that does not take part in a chemical reaction to an appreciable extent and/or a gas that excites a precursor (e.g., to facilitate polymerization of the precursor) when, for example, power (e.g., RF power) is applied, but unlike a reactant, it may not become a part of a film matrix to an appreciable extent.

As used herein, the term "substrate" can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as Group III-V or Group II-VI semiconductors, and can include one or more layers overlying or underlying the bulk material. Further, the substrate can include various features, such as gaps, lines, or protrusions, such as lines having recesses formed therebetween, and the like formed on or within or on at least a portion of a layer or bulk material of the substrate. By way of examples, one or more features (e.g., recesses, line, or protrusions) can have a width of about 10 nm to about 100 nm, a depth or height of about 30 nm to about 1,000 nm, and/or an aspect ratio of about 3 to 100.

In some embodiments, "film" refers to a layer extending in a direction perpendicular to a thickness direction. In some embodiments, "layer" refers to a material having a certain thickness formed on a surface and can be a synonym of a film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. The layer or film can be continuous—or not. Further, a single film or layer can be formed using multiple deposition cycles and/or multiple deposition and treatment cycles.

As used herein, the term "carbon layer" can refer to a layer whose chemical formula can be represented as including carbon. Layers comprising carbon material can include other elements, such as one or more of oxygen, nitrogen and hydrogen. Similarly, the term "carbon material" can refer to a material whose chemical formula can be represented as including carbon, and which can also include one or more of oxygen, nitrogen and hydrogen.

As used herein, the term "structure" can refer to a partially or completely fabricated device structure. By way of examples, a structure can be a substrate or include a substrate with one or more layers and/or features formed thereon.

As used herein, the term "cyclic deposition process" can refer to a vapor deposition process in which deposition cycles, typically a plurality of consecutive deposition cycles, are conducted in a process chamber. Cyclic deposition processes can include cyclic chemical vapor deposition (CVD) and atomic layer deposition processes. A cyclic deposition process can include one or more cycles that include (e.g., pulses of) plasma activation of a precursor, a reactant and/or an inert gas, and/or pulses of a precursor to a reaction chamber.

In this disclosure, "continuously" can refer to without breaking a vacuum, without interruption as a timeline, without any material intervening step, without changing treatment conditions, immediately thereafter, as a next step, or without an intervening discrete physical or chemical structure between two structures other than the two structures in some embodiments and depending on the context.

A flowability (e.g., an initial flowability) can be determined as follows:

TABLE 1

| bottom/top ratio (B/T) | Flowability |
| --- | --- |
| 0 < B/T < 1 | None |
| 1 ≤ B/T < 1.5 | Poor |
| 1.5 ≤ B/T < 2.5 | Good |
| 2.5 ≤ B/T < 3.5 | Very good |
| 3.5 ≤ B/T | Extremely good | where B/T refers to a ratio of thickness of film deposited at a bottom of a recess to thickness of film deposited on a top surface where the recess is formed, before the recess is filled. Typically, the flowability is evaluated using a wide recess having an aspect ratio of about 1 or less, since generally, the higher the aspect ratio of the recess, the higher the B/T ratio becomes. The B/T ratio generally becomes higher when the aspect ratio of the recess is higher. As used herein, a "flowable" film or material exhibits good or better flowability.

As set forth in more detail below, (e.g., initial) flowability of film can be obtained when a volatile hydrocarbon precursor, for example, is polymerized by a plasma and deposits on a surface of a substrate, wherein the gaseous precursor is activated or fragmented by energy provided by plasma gas discharge, so as to initiate polymerization. The resultant polymer material can exhibit temporarily (e.g., initial) flowable behavior. When a deposition step is complete and/or after a short period of time (e.g., about 3.0 seconds), the film may no longer be flowable, but rather becomes solidified, and thus, a separate solidification process may not be employed.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Figure 1:
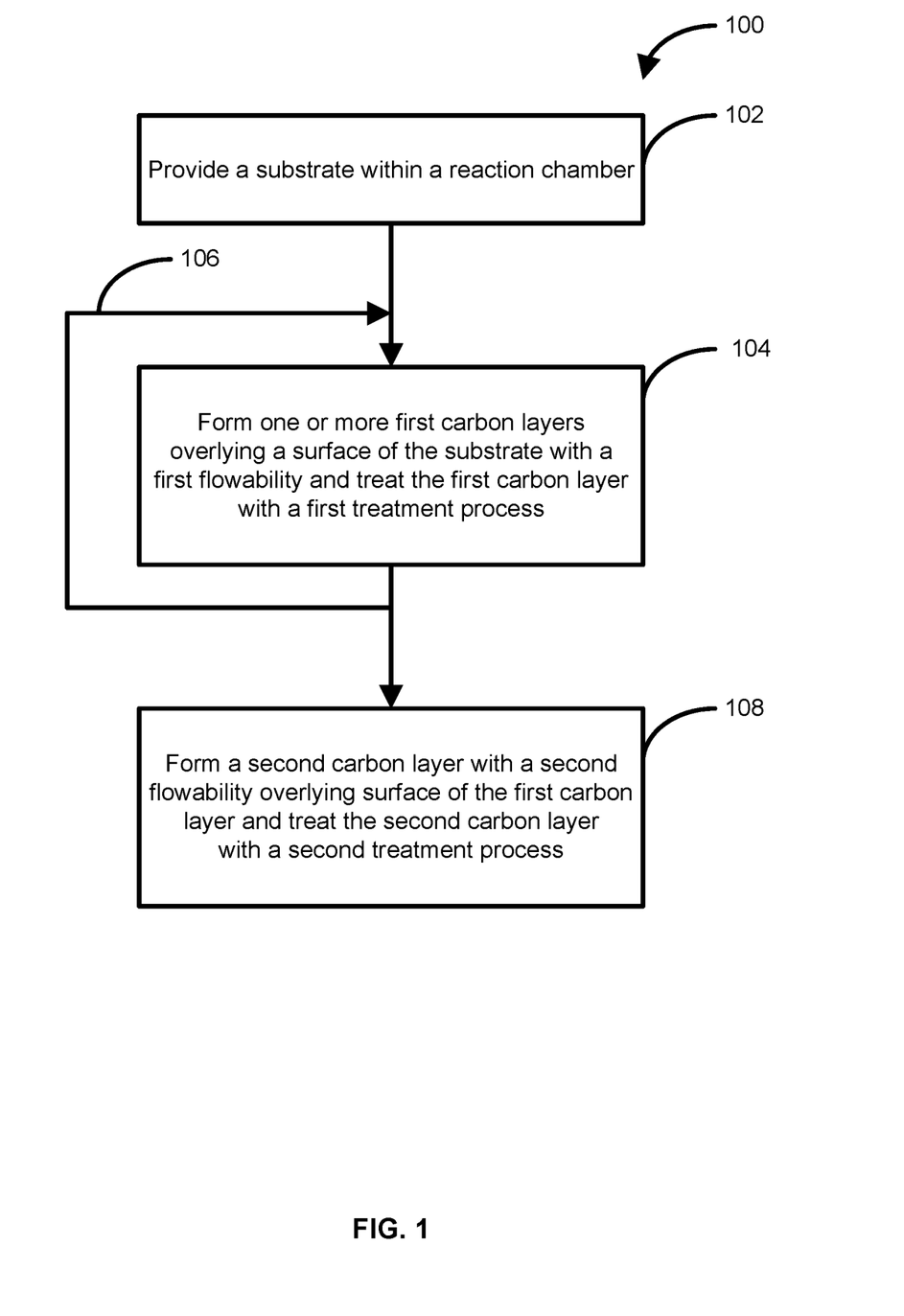
FIG. 1 illustrates a method in accordance with exemplary embodiments of the disclosure.

Turning now to the figures, FIG. 1 illustrates an exemplary method 100 in accordance with examples of the disclosure. Method 100 includes the steps of providing a substrate within a reaction chamber 102, forming one or more first carbon layers overlying the surface 104, at least one of the one or more first carbon layer having a first initial flowability, optionally repeating step 104 for a desired number of times (e.g., between 1 and 14), illustrated as loops/step 106, and then forming a second carbon layer with a second initial flowability overlying the one or more carbon layers 108. As set forth in more detail below, an example of steps 104 and/or 108 can include a step of treating initially flowable carbon material with a plasma process to form first and second carbon layers with desired properties.

During step 102 of providing a substrate within a reaction chamber, the substrate is provided into a reaction chamber of a gas-phase reactor. In accordance with examples of the disclosure, the reaction chamber can form part of a cyclical deposition reactor, such as an atomic layer deposition (ALD) (e.g., a plasma enhanced ALD (PEALD)) reactor or chemical vapor deposition (CVD) (e.g., a plasma enhanced CVD (PECVD)) reactor. Various steps of methods described herein can be performed within a single reaction chamber or can be performed in multiple reaction chambers, such as reaction chambers of a cluster tool. An exemplary reaction chamber suitable for use with method 100 is described in more detail below in connection with FIG. 6.

During step 102, the substrate can be brought to a desired temperature and/or the reaction chamber can be brought to a desired pressure, such as a temperature and/or pressure suitable for subsequent steps. By way of examples, a temperature (e.g., of a substrate or a substrate support) within a reaction chamber can be less than or equal to 100° C.—e.g., between ambient and less than 100° C. A pressure within the reaction chamber can be from about 200 Pa to about 1,250 Pa. In accordance with particular examples of the disclosure, the substrate includes one or more features. In some cases, the features can extend from a surface of the substrate. In these cases, a recess or trench (e.g., a multiple-trench structure) can be formed between the features.

Figure 2:
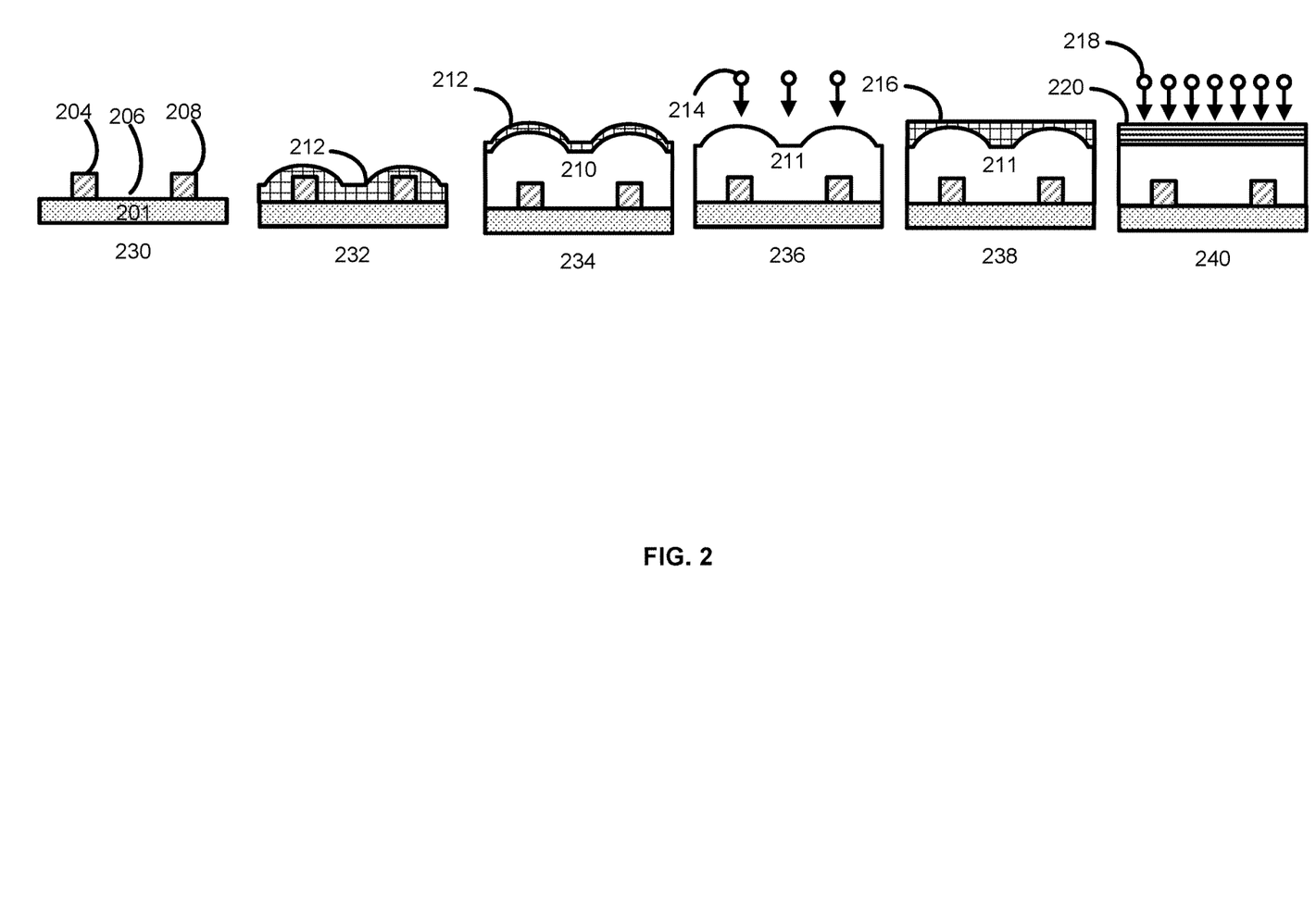
FIG. 2 illustrates structures formed in accordance with at least one embodiment of the disclosure.

With reference to FIGS. 1 and 2, an exemplary substrate 230 provided during step 102, may include a layer or bulk material 201 and features 204 and 208 and a recess (or trench) 206 formed therebetween overlying the layer or bulk material 201. During step 104 as illustrated in FIG. 2 an untreated (e.g., initially flowable) first carbon layer 212 with a first initial flowability may be deposited conformally over features 204, 208 to form structure 232. As set forth below, the untreated first carbon layer 212 can be treated, and step 104 (e.g., including a treatment) can be repeated to form structure 234, which includes a plurality of first carbon layers 210 and untreated first carbon layer 212.

Untreated first carbon layer 212 can be treated with a first treatment process using activated species 214, to form a one or more treated first carbon layers 211 and structure 236.

The first treatment process in step 104 may include an ion energy and a flux used to treat the untreated first carbon layer 212.

Further referencing FIGS. 1 and 2, during step 108, the second carbon layer is formed overlying one or more treated first carbon layers 211. More specifically, the second carbon layer can be formed by first depositing an (e.g., initially flowable) untreated second carbon layer 216 to form structure 238. In an exemplary embodiment, the untreated second carbon layer 216 has a second initial flowability, which is greater than the first initial flowability of untreated first carbon layer 212 formed in step 104. Flowability can depend on, for example a thickness of the initially viscous material; for example, an initially viscous material that is thicker can exhibit greater flowability. Therefore, in certain embodiments the untreated second carbon layer 216 is thicker than one or more untreated first carbon layers 212. The thickness of the untreated first carbon layer 212 and the untreated second carbon layer 216 can be controlled with process parameters such as a deposition time and a power used to form a deposition plasma. In certain embodiments, the untreated second carbon layer 216 can be made thicker and thus more flowable if at least one of the deposition time is greater, or the deposition power is greater than that of the untreated first carbon layer 212. During step 108 as illustrated by structure 240, untreated second carbon layer 216 is treated with a second treatment process including second activated species 218 to form treated second carbon layer 220. The second treatment process may include an ion energy and a flux used to treat the untreated second carbon layer 216 to form a treated second carbon layer 220. In certain embodiments, the second treatment process in step 108 may have a greater ion energy and/or flux than the first treatment process in step 104. For example, a plasma power and/or a plasma time during step 108 can be greater than a plasma power and/or a plasma time during step 104, such that all of carbon layer 216 is treated.

Figure 3:
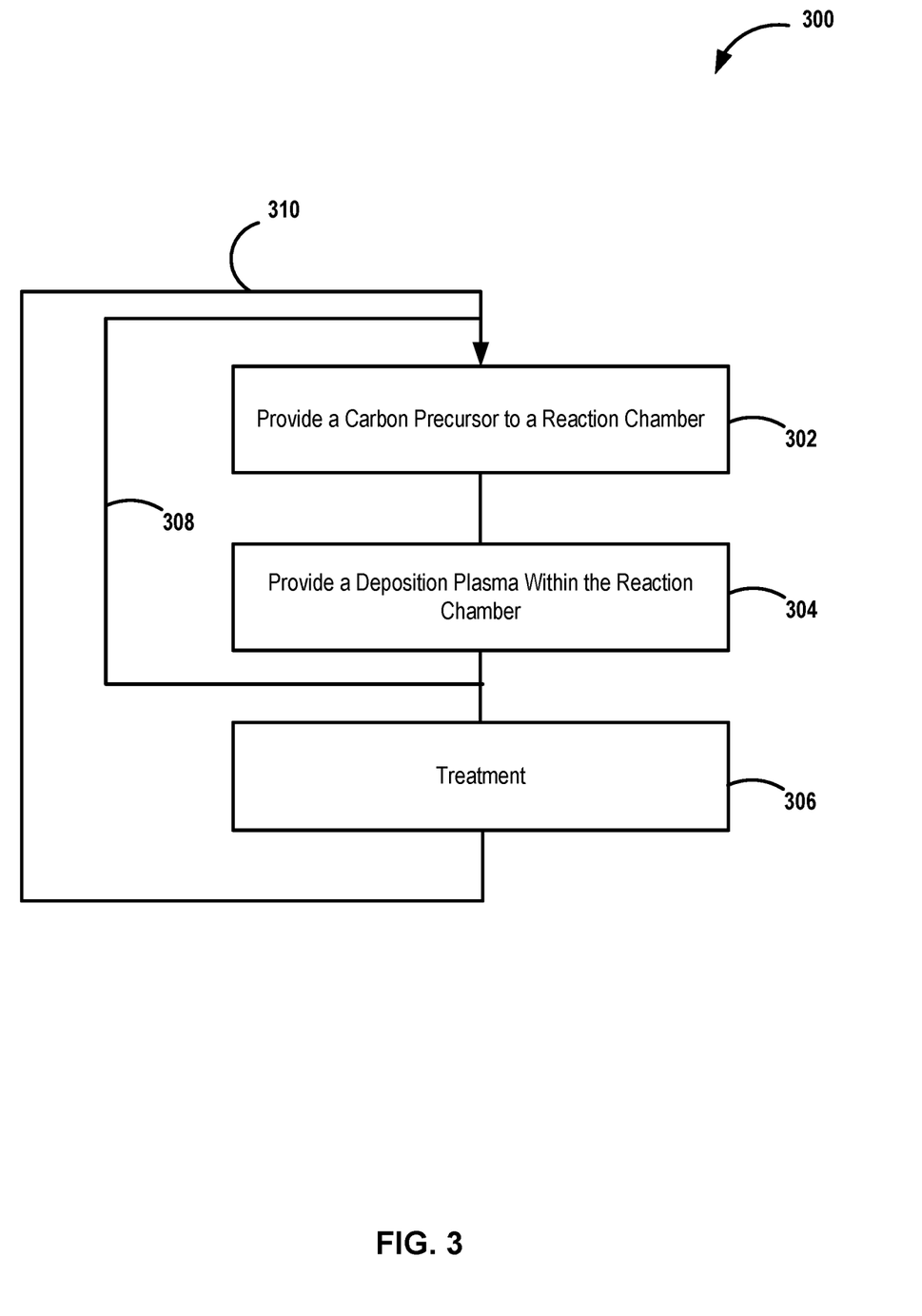
FIG. 3 illustrates a method in accordance with exemplary embodiments of the disclosure.

FIG. 3 illustrates an exemplary method 300 of forming a carbon layer—e.g., a first or a second carbon layer as described herein. Method 300 can be used for step 104 and/or step 108 of method 100. Different process parameters for method 300 listed below can be altered so that the second carbon layer in step 108 may be initially more flowable than the first carbon layer formed in step 104.

Method 300 includes the steps of providing a carbon precursor to the reaction chamber 302, providing a deposition plasma within the reaction chamber 304, and a treatment step 306. In addition, method 300 can include providing one or more inert gases to the reaction chamber and/or providing one or more reactant or carrier gases to the reaction chamber. The one or more inert gases can include, for example, one or more of argon, helium, and nitrogen, in any combination. By way of particular examples, the inert gas is or includes helium. A flowrate of the inert gas to the reaction chamber during this step can be from about 500 sccm to about 8,000 sccm. The inert gas can be used to provide active species to the reaction chamber, purge reactants and/or byproducts from the reaction chamber, and/or be used as a carrier gas to assist with delivery of the precursor to the reaction chamber.

During step 302, a carbon precursor for forming a carbon layer is introduced into the reaction chamber, in one example the carbon precursor is introduced into the reaction chamber along with the inert/carrier gases. Exemplary precursors include compounds represented by the formula $C_xH_yN_zO_a$, wherein x is a natural number of 2 or more, y is a natural number, z is 0 or a natural number, and a is 0 or a natural number. For example, x can range from about 2 to about 15, y can range from about 4 to about 30, z can range from about 0 to about 10, and a can range from about 0 to 05. The precursor can include a chain or cyclic molecule having two or more carbon atoms and one or more hydrogen atoms, such as molecules represented by the formula above. By way of particular examples, the precursor can be or include one or more cyclic (e.g., aromatic) structures and/or compounds having at least one double bond, and in some cases including two or more or three or more double bonds. By way of particular examples, the carbon precursor can be or include 1,3,5, trimethylbenzene or 2,4,6, trimethylpyridine.

A flowrate of the carbon precursor from a carbon precursor source to the reaction chamber can vary according to other process conditions. By way of examples, the flowrate can be from about 100 sccm to about 3,000 sccm. Similarly, a duration of each step of providing a carbon precursor to the reaction chamber can vary, depending on various considerations. By way of examples, the duration can range from about 1.0 seconds to about 35.0 seconds.

With continued reference to FIG. 3, during step 304, a deposition plasma is formed within the reaction chamber to form an initially viscous carbon material on a surface of the substrate. Once the carbon precursor is provided to the reaction chamber and a plasma is formed, the carbon precursor is converted into the initially viscous (flowable) material using excited species. The initially viscous carbon material can become a carbon layer—e.g., through further reaction with excited species. The carbon layer can be solid or substantially solid. A power used to ignite and maintain the plasma during step 302 can range from about 50 W to about 800 W. A frequency of the power can range from about 1 MHz to about 10 GHz. In one such embodiment, the power used to ignite and maintain the plasma may be higher in the second carbon layer than the power used to ignite and maintain the plasma in the first carbon layer, such that the second carbon layer is thicker, more flowable, and/or exhibits a higher growth per cycle.

A thickness of the first layer and the second layer can be controlled with process parameters such as deposition time and power. For example, the deposition time with the second carbon layer can be longer than deposition time with the first carbon layer which would create a thicker and more viscous second carbon layer.

During step 306, the carbon layer can be treated with activated species (e.g., formed using a plasma (e.g., radio frequency and/or microwave plasma) to form, for example, increased density and/or hardness of the carbon layer. A direct plasma and/or a remote plasma can be used to form the activated species.

Step 306 can include forming activated species from an inert gas. A power used to form the plasma can range from about 50 W to about 800 W. A frequency of the power can range from about 1 MHz to about 10 GHz.

In some cases, an inert gas can be continuously flowed to the reaction chamber and activated species can be periodically formed by cycling the power used to form the plasma. The species formation for treatment step can be formed in the same reaction chamber used for one or more or other steps or can be a separate reaction chamber, such as another reaction chamber of the same cluster tool.

A temperature within a reaction chamber during steps 302-306 can be less than or equal to 100° C. (e.g., between ambient and 100° C.). A pressure within a reaction chamber during the species formation for treatment can be from about 200 Pa to about 1,250 Pa.

As noted above, the second carbon layer may desirably be thicker and more viscous than one or more of the first carbon layers. In these cases, the second carbon layer can be treated by the ions with higher energy and/or higher flux than those with the first layer, such that the ions can reach to the bottom of the material of the second carbon layer to treat the entire second carbon layer.

Steps of various methods described herein can overlap and need not be performed in the order noted above. Further, in some cases, various steps or portions thereof can be repeated one or more times prior to a method proceeding to the next step. For example, steps 302 and 304 can be repeated one or more times—e.g., about 1 to about 20 times (repeat step 308) prior to method 300 proceeding to step 306. Similarly, steps 302-306 (with or without step 308) can be repeated a number of times 310 prior to proceeding to the next step (e.g., the next steps of method 100).

Figure 4:
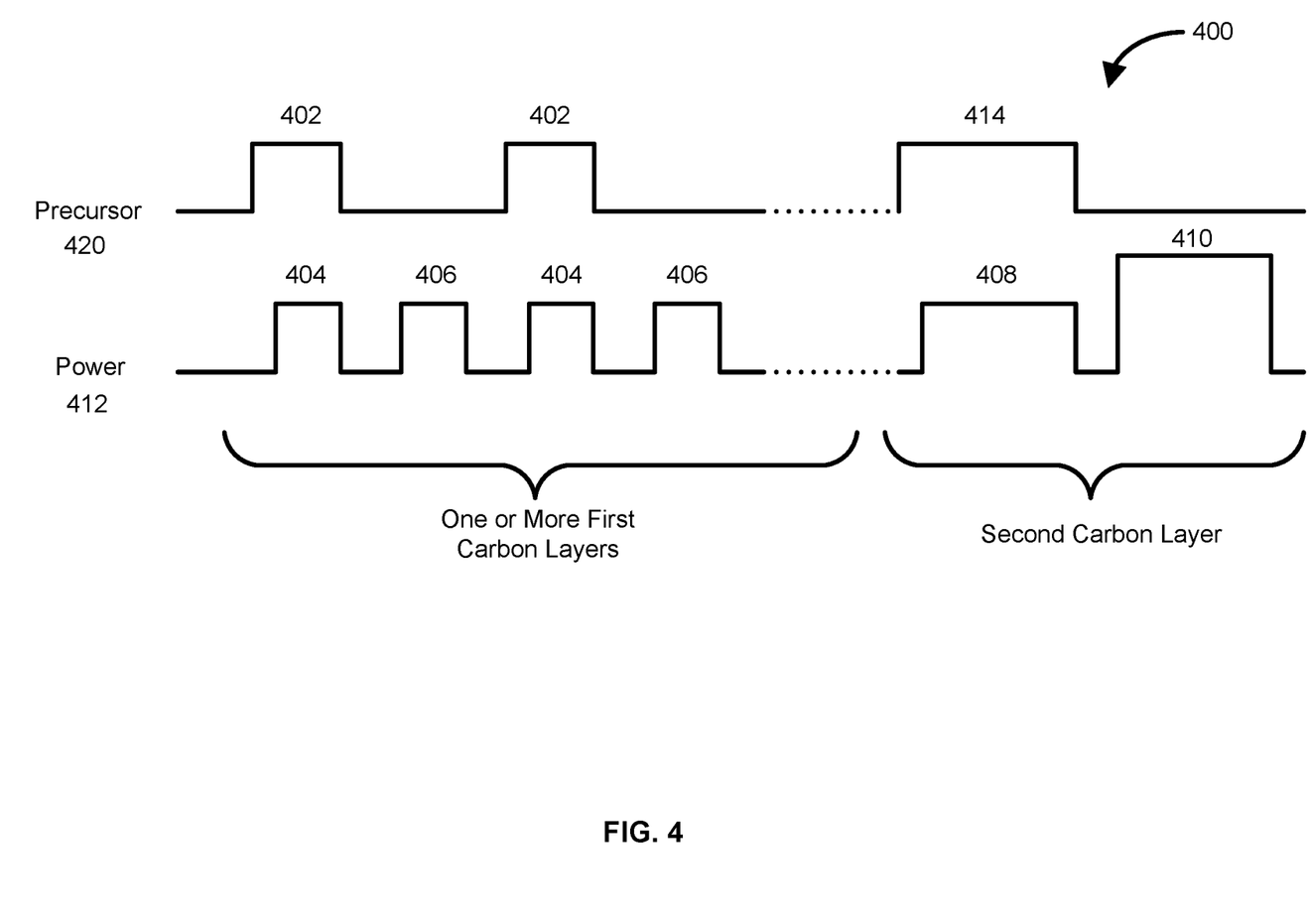
FIG. 4 illustrates a timing sequence diagram in accordance with exemplary embodiments of the disclosure.

FIG. 4 illustrates exemplary timing sequence diagrams suitable for use with method 100 and/or method 300. FIG. 4 illustrates carbon precursor, and plasma power pulses (one example of power used in this process is RF Power), where gases and/or plasma power are provided to the reaction chamber for a pulse period for the untreated first carbon layer 212 and the untreated second carbon layer 216 and for treating the deposited material. As noted above, an inert gas can be continuously provided to the reaction chamber and be used to form activate species as described herein. The inert gas may also be used as a carrier gas to introduce the carbon precursor to the reaction chamber. A width of the pulses may not necessarily be indicative of an amount of time associated with each pulse; the illustrated pulses can illustrate relative start times of the various pulses. Similarly, a height of an illustrated pulse may not necessarily be indicative of a specific amplitude or value, but can show relative high and low (e.g., on and off) values. These examples are merely illustrative and are not meant to limit the scope of the disclosure or claims.

Power (e.g. RF power) subsequence 412 can include one or more first carbon layer deposition pulse periods 404, for depositing the untreated first carbon layer 212, and one or more first carbon treatment pulse periods 406, for treating the untreated first carbon layer 212. In accordance with examples of these embodiments, a number of first carbon layer deposition pulse periods 404 and first carbon treatment pulse periods 406 is preferably equal and can range in number from about 1 to about 150. Power subsequence 412 also includes a second carbon layer deposition pulse period 408 for depositing the untreated second carbon layer 216 and a second carbon layer treatment pulse period 410 for treating the untreated second carbon layer 216. The embodiment depicted in FIG. 4 shows a preferred embodiment where the second carbon layer deposition pulse period 408 is greater than the first carbon layer deposition pulse period 404. FIG. 4 also depicts a preferred embodiment where the power and/or pulse period used in the second carbon layer treatment pulse period 410 is greater than the power and pulse period used in first carbon layer treatment pulse period 406.

As noted above, an exemplary embodiment of sequence 400 includes continuously supplying an inert gas to the reaction chamber during one or more of the first carbon layer and the second carbon layer deposition pulse periods 404 and 408 and/or one or more the first carbon layer and the second carbon layer treatment pulse periods 406 and 410. The inert gas can be provided to the reaction chamber prior to the first carbon layer deposition pulse period 404 and can end after the last second carbon layer treatment pulse period 410.

Sequence 400 also may include a precursor subsequence 420 for providing a carbon precursor to the reaction chamber for a precursor pulse period 402 for each step of forming one or more first carbon layers and for providing a carbon precursor to the reaction chamber for a precursor pulse period 414 for forming the second carbon layer. The precursor pulse period 402 can range from, for example, about 1 seconds to about 35 seconds. The precursor pulse period 414 can range from, for example, about 3 seconds to about 60 seconds. Each precursor pulse period 402 can be the same or vary in time; precursor pulse period 414 is preferably greater than precursor pulse period 402.

After the flow of the carbon precursor to the reaction chamber has started (pulse 402, or 414), power to form a plasma may be provided for pulse periods during one or more of the first carbon layer and the second carbon layer deposition pulse periods 404 and 408. Here, both the inert gas and the carbon precursor can be provided to the reaction chamber when the plasma is ignited/formed. The first carbon layer and the second carbon layer deposition pulse periods 404 and 408 can range from, for example, about 1 second to about 30 seconds. Each of the first carbon layer deposition pulse periods 404 can be the same or vary in time; the second carbon layer deposition pulse period 408 may be greater than the first carbon layer deposition pulse period 404.

As illustrated in this example, precursor pulse periods 402 ceases prior to first carbon layer and second carbon layer treatment pulse periods 406 and 410. Once the flow of the carbon precursor to the reaction chamber and the plasma power have ceased, the reaction chamber can be purged for a purge period. The purge period can range from, for example, about 5 seconds to about 30 seconds. Each purge period can be the same or vary in time.

A power (e.g., applied to electrodes) during the deposition pulse periods 404 and 408 can range from about 50 W to about 800 W. One embodiment of the present invention discloses that the power during deposition pulse period 404 is equal to the power during the deposition pulse period 408. The treatment pulse periods can range from about 1 second to about 30 seconds.

After the deposition pulse periods 404 and 408, a plasma power can be increased to a desired level for treating the carbon material with activated species for the treatment pulse periods 406 and 410. The power level and pressure within the reaction chamber can be as described above. The treatment pulse periods 406 and 410 may range from, for example, about 1 second to about 30 seconds. In an exemplary embodiment, each of the treatment pulse periods 406 can be the same or vary in time, while the treatment pulse period 410 is greater than the treatment pulse period 406. The frequency of the plasma power during the treatment pulse periods can change in order to control the ion energy.

After the step of treating the carbon material with activated species for one or more treatment pulse periods 406 and 410, the reaction chamber can be purged for a second purge period. The second purge period can range from, for example, about 10 seconds to about 70 seconds. Each second purge period can be the same or vary in time.

Figure 5:
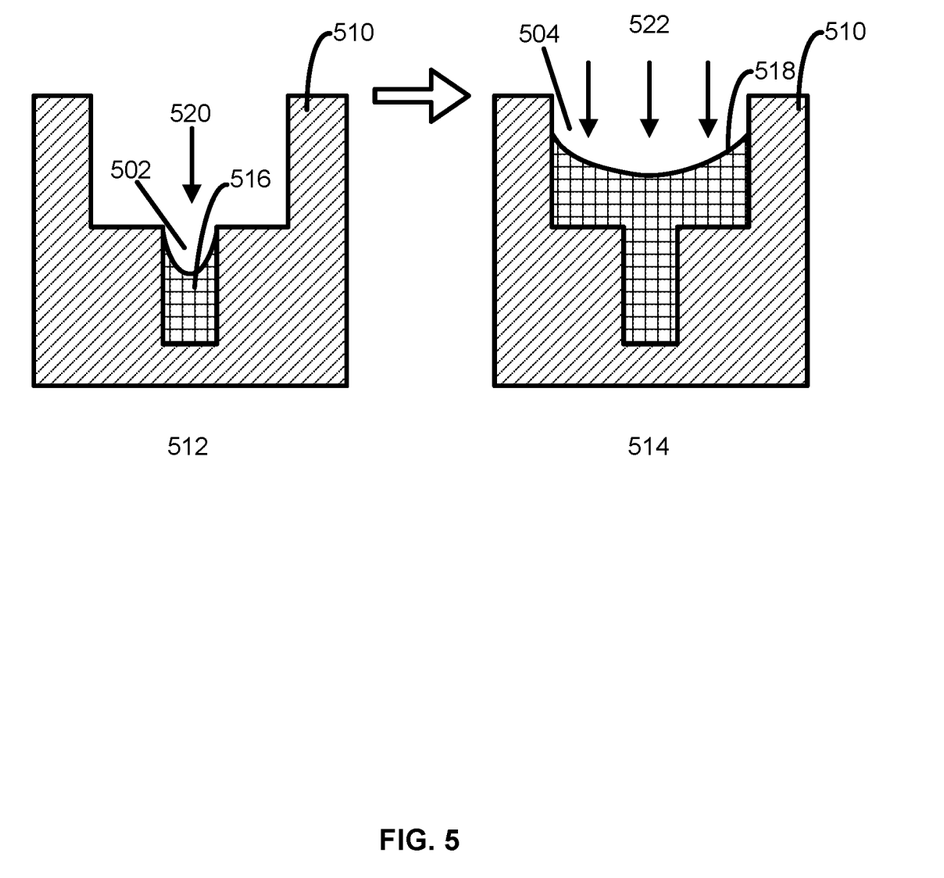
FIG. 5 illustrates multiple-trench structures in accordance with exemplary embodiments of the disclosure.

FIG. 5 illustrates exemplary multiple-trench structures 512 and 514 in accordance with the disclosure. Structure 512 illustrates one or more first carbon layers 516 within a trench 502 of substrate 510 (e.g., formed using method 300). A deposition rate of the initially flowable carbon used to form one or more first carbon layers 516 can exhibit a first growth per cycle of between 1 to 10 nm/cycle. Each of the one or more first carbon layers can be treated with a first treatment process 520. One or more second carbon layers can then be used to fill trench 504 by depositing a second initially flowable carbon material with a growth per cycle which is at least double the first growth per cycle. The second initially flowable carbon material can then be treated with a second treatment process 522 to form structure 514. In an exemplary embodiment, a thickness of the flowable carbon material exposed to treatment by the first and second treatment processes can similar between structures 512 and 514, or the second layer can be thicker than one or more of the first carbon layers.

Figure 6:
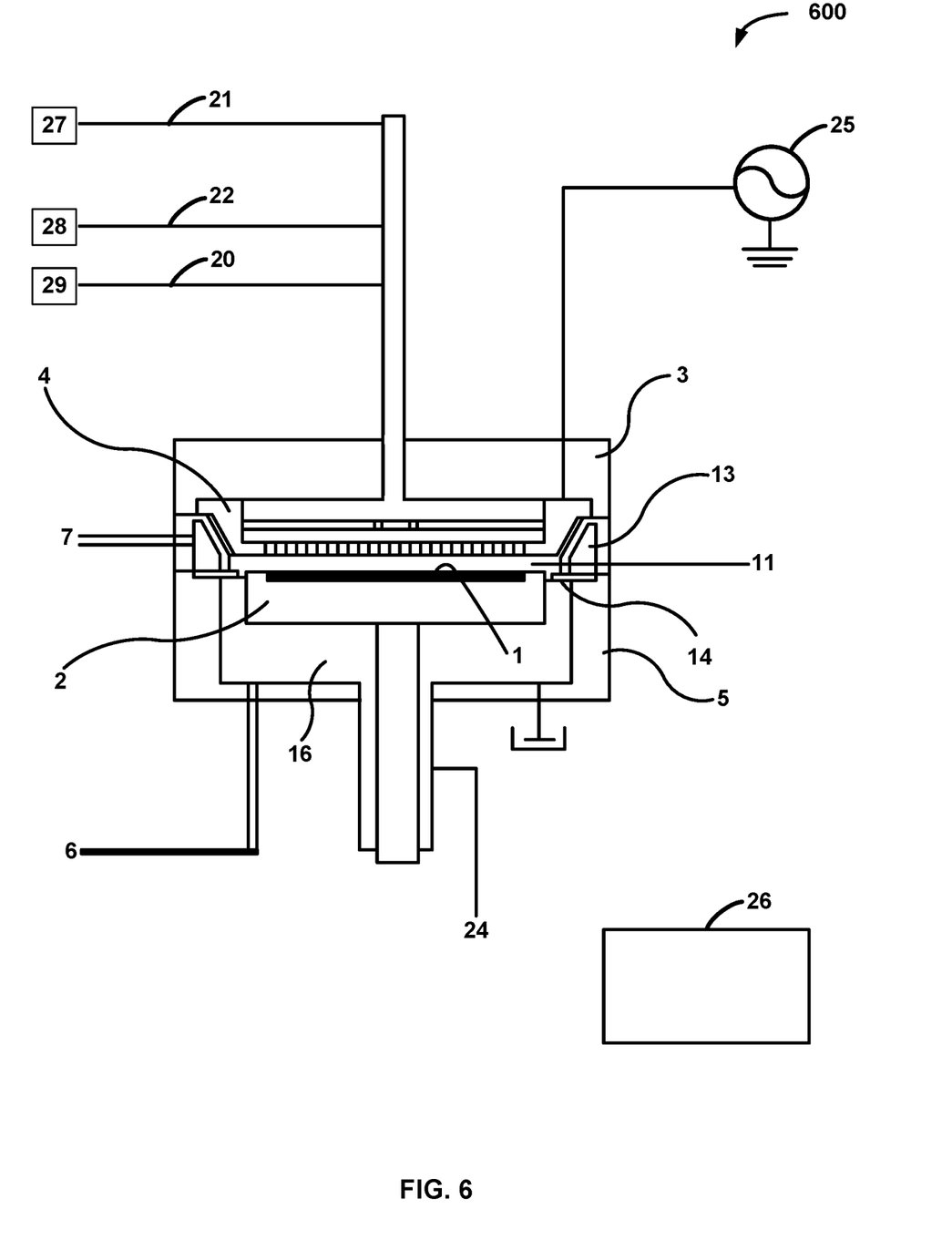

FIG. 6 illustrates a reactor system (sometimes referred to herein simply as system) 600 in accordance with exemplary embodiments of the disclosure. Reactor system 600 can be used to perform one or more steps or sub steps as described herein and/or to form one or more structures or portions thereof as described herein.

System 600 includes a pair of electrically conductive flat-plate electrodes 4, 2 in parallel and facing each other in the interior 11 (reaction zone) of a reaction chamber 3. A plasma can be excited within reaction chamber 3 by applying, for example, HRF power (e.g., 13.56 MHz or 27 MHz) from power source 25 to one electrode (e.g., electrode 4) and electrically grounding the other electrode (e.g., electrode 2). A temperature regulator can be provided in a lower stage 2 (the lower electrode), and a temperature of a substrate 1 placed thereon can be kept at a desired temperature. Electrode 4 can serve as a gas distribution device, such as a shower plate. Reactant gas, dilution gas, if any, precursor gas, and/or the like can be introduced into reaction chamber 3 using one or more of a gas line 20, a gas line 21, and a gas line 22, respectively, and through the shower plate 4. Although illustrated with three gas lines, reactor system 600 can include any suitable number of gas lines. Gas line 20 can be coupled to a carbon precursor source 29, gas line 21 can be coupled to an inert gas source 27, and gas line 22 can be coupled to another (e.g., carrier) gas source 28.

In reaction chamber 3, a circular duct 13 with an exhaust line 7 is provided, through which gas in the interior 11 of the reaction chamber 3 can be exhausted. Additionally, a transfer region 5, disposed below the reaction chamber 3, is provided with a seal gas line 24 to introduce seal gas into the interior 11 of the reaction chamber 3 via the interior 16 (transfer zone) of the transfer region 5, wherein a separation plate 14 for separating the reaction zone and the transfer zone is provided (a gate valve through which a wafer is transferred into or from the transfer region 5 is omitted from this figure). The transfer region is also provided with an exhaust line 6. In some embodiments, the deposition and treatment steps are performed in the same reaction space, so that two or more (e.g., all) of the (e.g., deposition, including treatment) steps for first and/or second carbon layers can continuously be conducted without exposing the substrate to air or other oxygen-containing atmosphere.

In some embodiments, continuous flow of an inert or carrier gas to reaction chamber 3 can be accomplished using a flow-pass system (FPS), wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber and can carry the precursor gas in pulses by switching between the main line and the detour line, without substantially fluctuating pressure of the reaction chamber.

A skilled artisan will appreciate that the apparatus includes one or more controller(s) 26 programmed or otherwise configured to cause one or more method steps as described herein to be conducted. The controller(s) are communicated with the various power sources, heating systems, pumps, robotics and gas flow controllers, or valves of the reactor, as will be appreciated by the skilled artisan. By way of examples, the controller can be configured to control gas flow of a carbon precursor into at least one of the one or more reaction chambers to form a first carbon layer and a second carbon layer overlying the first carbon layer, wherein a flowability and/or thickness of the second carbon layer is greater than a flowability and/or thickness of the first carbon layer. The controller can be further configured to control a first plasma process that treats the first carbon layer with a first ion energy level and a first flux, wherein the controller is configured to control a second plasma process that treats the second carbon layer with a second ion energy level and a second flux, wherein, at least one of: the second ion energy level is greater than the first ion energy level, and the second flux is greater than the first flux.

In some embodiments, a dual chamber reactor (two sections or compartments for processing wafers disposed close to each other) can be used, wherein a reactant gas and a noble gas can be supplied through a shared line, whereas a precursor gas is supplied through unshared lines.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method, comprising the steps of:
   providing a substrate within a reaction chamber, the substrate comprising one or more recesses formed on a surface of the substrate;
   forming one or more first carbon layers overlying the surface, at least one of the one or more first carbon layer having a first initial flowability; and
   forming a second carbon layer overlying the one or more first carbon layers, the second carbon layer having a second initial flowability,
   wherein the second initial flowability is greater than the first initial flowability,
   wherein the step of forming one or more first carbon layers comprises one or more cycles of: forming first initially viscous layer within the one or more recesses and treating the first initially viscous layer using a first plasma process.

2. The method of claim 1, wherein at least one recess of the one or more recesses comprises a multiple-trench structure.

3. The method of claim 1, wherein the second carbon layer is thicker than at least one of the one or more first carbon layers.

4. The method of claim 1, wherein the step of forming the second carbon layer comprises forming a second initially viscous layer and treating the second initially viscous layer using a second plasma process.

5. The method of claim 4, wherein the first plasma process comprises a first plasma power, wherein the second plasma process comprises a second plasma power, and wherein the second plasma power is greater than the first plasma power.

6. The method of claim 4, wherein the first initially viscous layer is treated with the first plasma process for a first treatment time, and wherein the second initially viscous layer is treated with the second plasma process for a second treatment time, wherein the second treatment time is greater than the first treatment time.

7. The method of claim 4, wherein the first plasma process comprises a first ion energy level and a first flux, and wherein the second plasma process comprises a second ion energy level and a second flux, wherein the second ion energy level is greater than the first ion energy level.

8. The method of claim 7, wherein the second flux is greater than the first flux.

9. The method of claim 4, wherein at least one of the first plasma process or the second plasma process comprises forming excited species from one or more of He, Ar, and $N_2$.

10. The method of claim 1, wherein a deposition time for the step of forming a second carbon layer is greater than a deposition time for forming one or more first carbon layers.

11. The method of claim 1, wherein a surface of the second carbon layer is planarized.

12. The method of claim 1, wherein a temperature within the reaction chamber during the step of forming the one or more first carbon layers is less than 100° C.

13. The method of claim 1, wherein a temperature within the reaction chamber during the step of forming the second carbon layer is less than 100° C.

14. The method of claim 1, wherein the forming one or more first carbon layers is repeated a first number of times, wherein the forming the second carbon layer step is repeated a second number of times, wherein the first number of times is greater than the second number of times.

15. The method of claim 1, wherein the step of forming the forming one or more first carbon layers comprises providing a carbon precursor to the reaction chamber, wherein a chemical formula of the carbon precursor is represented by $C_xH_yN_2O_a$, wherein x is a natural number of 2 or more, y is a natural number, z is 0 or a natural number, and a is 0 or a natural number.

16. The method of claim 1, wherein the step of forming the second carbon layer comprises providing a carbon precursor to the reaction chamber, wherein a chemical formula of the carbon precursor is represented by $C_xH_yN_2O_a$, wherein x is a natural number of 2 or more, y is a natural number, z is 0 or a natural number, and a is 0 or a natural number.

17. The method of claim 1, wherein the forming one or more first carbon layers step comprises a first growth per cycle level, and the forming the second carbon layer step comprises a second growth per cycle level, wherein the second growth per cycle level is greater than the first growth per cycle level.

18. A method, comprising the steps of:
   providing a substrate within a reaction chamber, the substrate comprising one or more recesses formed on a surface of the substrate;
   forming a first carbon layer overlying the surface by depositing a first initially flowable carbon layer having a first initial flowability and treating the first initially flowable carbon layer with a first ion energy level and a first flux;
   forming a second carbon layer overlying the first carbon layer by depositing a second initially flowable carbon layer, the second initially flowable carbon layer having a second initial flowability, and treating the second initially flowable carbon layer with a second ion energy level and a second flux,
   wherein the second initial flowability is greater than the first initial flowability, and
   wherein, at least one of:
      the second ion energy level is greater than the first ion energy level, or
      the second flux is greater than the first flux.

19. The method of claim 18, wherein at least one recess of the one or more recesses comprises a multiple-trench structure.

20. The method of claim 18, wherein the step of forming the first carbon layer comprises providing a carbon precursor to the reaction chamber, wherein a chemical formula of the carbon precursor is represented by $C_xH_yN_2O_a$, wherein x is a natural number of 2 or more, y is a natural number, z is 0 or a natural number, and a is 0 or a natural number.

21. The method of claim 18, wherein the step of forming the second carbon layer comprises providing a carbon precursor to the reaction chamber, wherein a chemical formula of the carbon precursor is represented by $C_xH_yN_zO_a$, wherein x is a natural number of 2 or more, y is a natural number, z is 0 or a natural number, and a is 0 or a natural number.

* * * * *